(12) United States Patent
Mi et al.

(10) Patent No.: US 12,696,699 B2
(45) Date of Patent: ***Jul. 28, 2026

(54) EPITAXIAL GALLIUM NITRIDE ALLOY FERROELECTRONICS

(71) Applicant: The Regents of the University of Michigan, Ann Arbor, MI (US)

(72) Inventors: Zetian Mi, Ann Arbor, MI (US); Ping Wang, Ann Arbor, MI (US); Ding Wang, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 832 days.

This patent is subject to a terminal disclaimer.

(21) Appl. No.: 17/940,759

(22) Filed: Sep. 8, 2022

(65) Prior Publication Data

US 2023/0070465 A1     Mar. 9, 2023

Related U.S. Application Data

(60) Provisional application No. 63/241,862, filed on Sep. 8, 2021.

(51) Int. Cl.
  *H10D 62/10*     (2025.01)
  *C30B 25/10*     (2006.01)
  (Continued)

(52) U.S. Cl.
  CPC ........ *H10P 14/69396* (2026.01); *C30B 25/10* (2013.01); *C30B 25/18* (2013.01); *C30B 29/406* (2013.01); *H10B 51/30* (2023.02);

*H10D 30/015* (2025.01); *H10D 30/0415* (2025.01); *H10D 30/475* (2025.01); *H10D 30/701* (2025.01);

(Continued)

(58) Field of Classification Search
None
See application file for complete search history.

(56) References Cited

U.S. PATENT DOCUMENTS

2018/0138303 A1*   5/2018  Coffie ................... H10D 62/80
2019/0181240 A1*   6/2019  Fareed .............. H10D 30/4732
(Continued)

FOREIGN PATENT DOCUMENTS

WO       2023022768 A9     4/2023

OTHER PUBLICATIONS

C. Constantin et al.; Composition-dependent structural properties in ScGaN alloy films: A combined experimental and theoretical study; Journal of applied physics vol. 98; 2005; 123501.
(Continued)

*Primary Examiner* — Xiaoming Liu
(74) *Attorney, Agent, or Firm* — Lempia Summerfield Katz LLC

(57) ABSTRACT

A method of fabricating a heterostructure includes providing a substrate, and implementing a non-sputtered, epitaxial growth procedure at a growth temperature to form a wurtzite structure supported by the substrate. The wurtzite structure includes an alloy of gallium nitride. The non-sputtered, epitaxial growth procedure is configured to incorporate a group IIIB element into the alloy. The wurtzite structure exhibits a breakdown field strength greater than a ferroelectric coercive field strength of the wurtzite structure.

20 Claims, 15 Drawing Sheets

(a)

(b)

(51) Int. Cl.

| | |
|---|---|
| *C30B 25/18* | (2006.01) |
| *C30B 29/40* | (2006.01) |
| *H10B 51/30* | (2023.01) |
| *H10D 30/01* | (2025.01) |
| *H10D 30/47* | (2025.01) |
| *H10D 30/69* | (2025.01) |
| *H10D 62/85* | (2025.01) |
| *H10D 64/01* | (2025.01) |
| *H10D 64/68* | (2025.01) |
| *H10P 14/692* | (2026.01) |

(52) U.S. Cl.

CPC ....... *H10D 62/102* (2025.01); *H10D 62/8503* (2025.01); *H10D 64/033* (2025.01); *H10D 64/689* (2025.01); *H10P 14/69397* (2026.01)

(56) References Cited

U.S. PATENT DOCUMENTS

| | | | |
|---|---|---|---|
| 2020/0303586 A1* | 9/2020 | Ahmed | H10H 20/82 |
| 2024/0242963 A1* | 7/2024 | Mi | H10D 64/689 |

OTHER PUBLICATIONS

C. Constantin et al.; ScGaN alloy growth by molecular beam epitaxy: Evidence for a metastable layered hexagonal phase; Physical Review B vol. 70; 2004; 193309.

C. E. Dreyer et al.; Correct Implementation of Polarization Constants in Wurtzite Materials and Impact on III-Nitrides; Physical Review X vol. 6; 2016; 021038.

D. Drury et al.; Understanding Reproducibility of Sputter-Deposited Metastable Ferroelectric Wurtzite Al0.6Sc0.4N Films Using In Situ Optical Emission Spectrometry; Phys. Status Solidi RRL vol. 15, 2021; 2100043; pp. 1-6.

D. Jena et al.; The new nitrides: layered, ferroelectric, magnetic, metallic and superconducting nitrides to boost the GaN photonics and electronics eco-system; Japanese Journal of Applied Physics, vol. 58, 2019; SC0801.

D. Wang et al.; Ferroelectric Switching in Sub-20 nm Aluminum Scandium Nitride Thin Films; IEEE Electron Device Letters vol. 41; 2020; pp. 1774-1777.

D. Wang et al.; Sub-Microsecond Polarization Switching in (Al,Sc)N Ferroelectric Capacitors Grown on Complementary Metal-Oxide-Semiconductor-Compatible Aluminum Electrodes; Physica Status Solidi (RRL)—Rapid Research Letters vol. 15; 2021; 2000575.

F. Tasnádi et al.; Origin of the Anomalous Piezoelectric Response in Wurtzite ScxAl1-xN Alloys; Phys Rev Lett vol. 104; 2010; 137601.

H. C. L. Tsui et al.; Band gaps of wurtzite ScxGa1-xN alloys; Applied Physics Letters vol. 106; 2015; 132103.

H. C. L. Tsui et al.; Composition measurement of epitaxial ScxGa1-xN films; Semiconductor Science and Technology vol. 31; 2016; 064002.

H. Tsui et al.; The effect of metal-rich growth conditions on the microstructure of ScxGa1-xN films grown using molecular beam epitaxy; Physica Status Solidi A vol. 212; 2015; pp. 2837-2842.

J. Casamento et al.; Oxygen Incorporation in the Molecular Beam Epitaxy Growth of ScxGa1-xN and ScxAl1-xN; Phys. Status Solid B vol. 257; 2020; 1900612.

J. F. Scott; Models for the frequency dependence of coercive field and the size dependence of remanent polarization in ferroelectric thin films; Integrated Ferroelectrics vol. 12; 1996; pp. 71-81.

J. J. Wierer et al.; III-nitride photonic-crystal light-emitting diodes with high extraction efficiency; Nature Photonics vol. 3; 2009; pp. 163-169.

J. Wang et al.; Ferroelectric Aluminum Scandium Nitride Thin Film Bulk Acoustic Resonators with Polarization-Dependent Operating States; Physica Status Solidi (RRL)—Rapid Research Letters vol. 15; 2021; 2100034.

J. Íñiguez et al. Ferroelectric negative capacitance; Nature Reviews Materials vol. 4; 2019; pp. 243-256.

M. Akiyama et al.; Enhancement of Piezoelectric Response in Scandium Aluminum Nitride Alloy Thin Films Prepared by Dual Reactive Cosputtering; Adv Mater vol. 21; 2009; pp. 593-596.

M. G. Kibria et al.; Visible light-driven efficient overall water splitting using p-type metal-nitride nanowire arrays; Nature Communications vol. 6; 2015; 6797; pp. 1-8.

M. Moram et al.; Structural properties of wurtzitelike ScGaN films grown by NH3-molecular beam epitaxy; Journal of applied physics vol. 106; 2009; 113533.

M. Noor-A-Alam et al.; Ferroelectricity and Large Piezoelectric Response of AIN/ScN Superlattice; ACS applied materials & interfaces vol. 11; 2019; pp. 20482-20490.

M. Uehara et al.; Increase in the piezoelectric response of scandium-doped gallium nitride thin films sputtered using a metal interlayer for piezo MEMS; Applied Physics Letters vol. 114; 2019; 012902.

N. Wolff et al.; Atomic scale confirmation of ferroelectric polarization inversion in wurtzite-type AlScN; Journal of Applied Physics vol. 129; 2021; 034103.

P. Wang et al.; Fully epitaxial ferroelectric ScAlN grown by molecular beam epitaxy; Applied Physics Letters vol. 118; 2021; 223504.

P. Wang et al.; Molecular beam epitaxy and characterization of wurtzite ScxAl1-xN; Applied Physics Letters vol. 116; 2020; 151903.

P. Wang et al.; Oxygen defect dominated photoluminescence emission of ScxAl1-xN grown by molecular beam epitaxy; Appl. Phys. Lett. vol. 118; 2021; 032102.

R. Meyer et al.; Dynamic leakage current compensation in ferroelectric thin-film capacitor structures; Applied Physics Letters vol. 86; 20015; 142907.

S. Fichtner et al.; AlScN: A III-V semiconductor based ferroelectric; Journal of Applied Physics vol. 125; 2019; 114103.

S. Knoll et al.; Defects in epitaxial ScGaN: Dislocations, stacking faults, and cubic inclusions; Applied Physics Letters vol. 104; 2014; 101906.

S. M. Yang et al.; ac dynamics of ferroelectric domains from an investigation of the frequency dependence of hysteresis loops; Physical Review B vol. 82; 2010; 174125.

S. Rassay et al.; A Segmented-Target Sputtering Process for Growth of Sub-50 nm Ferroelectric Scandium-Aluminum-Nitride Films with Composition and Stress Tuning; Physica Status Solidi (RRL)—Rapid Research Letters vol. 15; 2021; 2100087.

S. Y. Zhang et al.; Tunable optoelectronic and ferroelectric properties in Sc-based III-nitrides; Journal of Applied Physics vol. 114; 2013; 133510; pp. 1-11.

S. Yasuoka et al.; Effects of deposition conditions on the ferroelectric properties of (Al1-xScx)N thin films; Journal of Applied Physics vol. 128; 2020; 114103.

S. Zhang et al.; Elastic constants and critical thicknesses of ScGaN and ScAlN; Journal of Applied Physics vol. 114; 2013; 243516.

S. Zhao et al.; III-Nitride nanowire optoelectronics; Progress in Quantum Electronics vol. 44; 2015; pp. 14-68.

S.-L. Tsai et al.; Room-temperature deposition of a poling-free ferroelectric AlScN film by reactive sputtering; Applied Physics Letters vol. 118; 2021; 082902.

T. J. Flack et al.; GaN Technology for Power Electronic Applications: A Review; Journal of Electronic Materials vol. 45; 2016; pp. 2673-2682.

T. Mikolajick et al.; Next generation ferroelectric materials for semiconductor process integration and their applications; Journal of Applied Physics vol. 129; 2021; 100901.

W. Zhang et al.; Influence of the Interface Acceptor-Like Traps on the Transient Response of AlGaN/GaN HEMTs; IEEE Electron Device Letters vol. 34; 2013; pp. 45-47.

X. Liu et al.; Aluminum scandium nitride-based metal-ferroelectric-metal diode memory devices with high on/off ratios; Applied Physics Letters vol. 118; 2021; 202901.

X. Liu et al.; Post-CMOS Compatible Aluminum Scandium Nitride/2D Channel Ferroelectric Field-Effect-Transistor Memory; Nano Letters vol. 21; 2021; pp. 3753-3761.

* cited by examiner

EPITAXIAL GALLIUM NITRIDE ALLOY FERROELECTRICS

CROSS-REFERENCE TO RELATED APPLICATION

This application claims the benefit of U.S. provisional application entitled "Epitaxial Gallium Nitride Alloy Ferroelectrics," filed Sep. 8, 2021, and assigned Ser. No. 63/241,862, the entire disclosure of which is hereby expressly incorporated by reference.

STATEMENT REGARDING FEDERALLY SPONSORED RESEARCH OR DEVELOPMENT

This invention was made with government support under Contract No. N00014-19-1-2225 awarded by the U.S. Office of Naval Research. The government has certain rights in the invention.

BACKGROUND OF THE DISCLOSURE

Field of the Disclosure

The disclosure relates generally to ferroelectric Group III-nitride materials.

Brief Description of Related Technology

Owing to the widely tunable direct bandgap and strong spontaneous and piezoelectric polarization, III-nitride semiconductors have been investigated for applications in power electronics, optoelectronics and piezoelectronics. Recently, to harness the ultimate potential of III-nitride semiconductors, non-IIIA metal elements, such as Sc, have been introduced into conventional wurtzite III-nitride lattices, which can lead to new material properties and promise multifunctional and cross-field applications. The distortion of the original wurtzite-type crystal structure induced by Sc atoms has been shown to not only enhance the piezoelectricity but also enable ferroelectric switching in $Sc_xAl_{1-x}N$ films.

The ferroelectricity in $Sc_xAl_{1-x}N$ results from a flattened potential energy landscape and a tendency towards the non-polar layered hexagonal phase in the metastable wurtzite structure with Sc incorporation. Given that III-nitrides exhibit prominent spontaneous polarization along the c-axis and are relatively immune to harsh environments, the ability to control the direction of their electrical polarization enables intriguing applications in memory, reconfigurable power devices/piezo devices, and photovoltaics with unprecedented stability, performance, and functionality. The negative capacitance related to ferroelectric dielectrics is also useful in the integration of ferroelectric nitrides with conventional GaN based high electron mobility transistors (HEMTs) to enhance the gate controllability and promote significant size reduction. In this context, studies have been conducted on the synthesis, characterization, and device applications of ferroelectric $Sc_xAl_{1-x}N$ using sputter deposition.

Theoretical studies have predicted that the incorporation of Sc in GaN could also enhance the piezo response and reduce the polarization switching barrier in the manner similar to that of $Sc_xAl_{1-x}N$. It has been demonstrated that the c/a ratio of $Sc_xGa_{1-x}N$ tends to decrease with increasing Sc content. Significant attention has been paid to the synthesis and characterization of $Sc_xGa_{1-x}N$. The lattice parameters, band gaps, and band alignments as well as the piezo response of $Sc_xGa_{1-x}N$ have been revealed in several recent studies. To date, however, there has been no demonstration of ferroelectricity in $Sc_xGa_{1-x}N$, thereby limiting the potential of nitride-based ferroelectronics.

SUMMARY OF THE DISCLOSURE

In accordance with one aspect of the disclosure, a method of fabricating a heterostructure includes providing a substrate, and implementing a non-sputtered, epitaxial growth procedure at a growth temperature to form a wurtzite structure supported by the substrate. The wurtzite structure includes an alloy of gallium nitride. The non-sputtered, epitaxial growth procedure is configured to incorporate a group IIIB element into the alloy. The wurtzite structure exhibits a breakdown field strength greater than a ferroelectric coercive field strength of the wurtzite structure.

In accordance with another aspect of the disclosure, a device includes a substrate, and a heterostructure supported by the substrate. The heterostructure includes a monocrystalline layer of an alloy of gallium nitride. The alloy includes a Group IIIB element.

In connection with any one of the aforementioned aspects, the devices and/or methods described herein may alternatively or additionally include or involve any combination of one or more of the following aspects or features. The method further includes forming a semiconductor layer supported by the substrate before implementing the non-sputtered, epitaxial growth procedure such that the wurtzite structure is formed on the semiconductor layer. Forming the semiconductor layer includes forming a gallium nitride layer on the substrate. Forming the semiconductor layer includes growing the semiconductor layer in an epitaxial growth chamber in which the non-sputtered, epitaxial growth procedure for the wurtzite structure is implemented such that the substrate is not removed from the epitaxial growth chamber between forming the semiconductor layer and implementing the non-sputtered, epitaxial growth procedure. The method further includes forming a semiconductor layer after implementing the non-sputtered, epitaxial growth procedure such that the semiconductor layer is in contact with the wurtzite structure. Forming the semiconductor layer includes growing the semiconductor layer in an epitaxial growth chamber in which the non-sputtered, epitaxial growth procedure for the wurtzite structure is implemented such that the substrate is not removed from the epitaxial growth chamber between implementing the non-sputtered, epitaxial growth procedure and forming the semiconductor layer. The group IIIB element is scandium. The scandium has a content falling in a range from about 0.31 to about 0.41. The substrate includes sapphire. The growth temperature is about 600 degrees Celsius or lower. In some cases, the non-sputtered, epitaxial growth procedure has a nitrogen-to-metal flux ratio greater than 1. The monocrystalline layer exhibits a breakdown field strength greater than a ferroelectric coercive field strength of the monocrystalline layer. The heterostructure further includes a semiconductor layer disposed between the substrate and the monocrystalline layer. The semiconductor layer is in contact with the monocrystalline layer. The semiconductor layer includes gallium nitride. The device further includes a metal layer disposed between the substrate and the heterostructure, wherein the metal layer is in contact with the heterostructure. The group IIIB element is scandium. The scandium has a content falling in a range from about 0.31 to about 0.41. The heterostructure further includes a semiconductor layer supported by, and in contact with, the monocrystalline layer. The semiconductor layer includes gallium nitride.

BRIEF DESCRIPTION OF THE DRAWING FIGURES

For a more complete understanding of the disclosure, reference should be made to the following detailed description and accompanying drawing figures, in which like reference numerals identify like elements in the figures.

Figure 1:
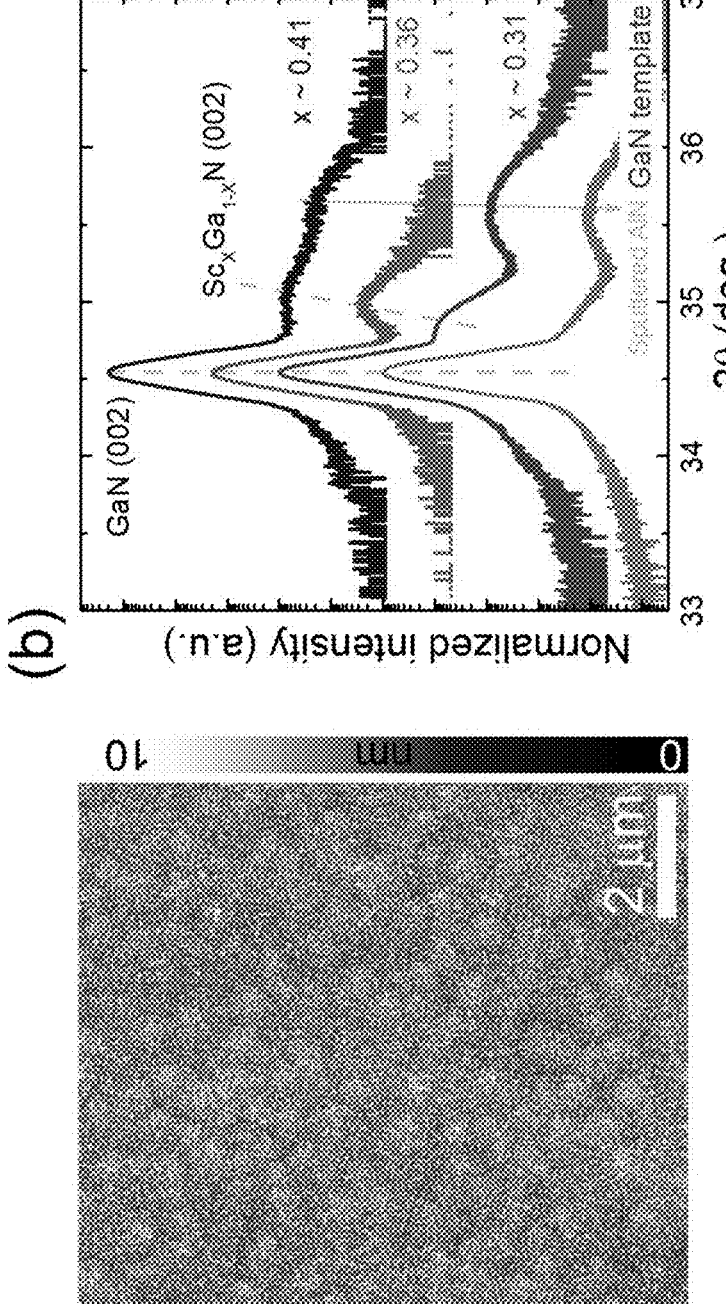
FIG. 1 depicts an atomic force microscope (AFM) image of an epitaxially grown $Sc_xGa_{1-x}N$ layer that exhibits ferroelectric characteristics in accordance with one example, along with a graphical plot of XRD 2θ-ω scans of example $Sc_xGa_{1-x}N$ films with x=0.31, 0.36, and 0.41.

The embodiments of the disclosed devices and methods may assume various forms. Specific embodiments are illustrated in the drawing and hereafter described with the understanding that the disclosure is intended to be illustrative. The disclosure is not intended to limit the invention to the specific embodiments described and illustrated herein.

DETAILED DESCRIPTION OF THE DISCLOSURE

Methods for growth of epitaxial (e.g., fully epitaxial) ferroelectric alloys of gallium nitride are described. The disclosed methods are configured to incorporate scandium (Sc) or other group IIIB elements into the wurtzite crystal structure of gallium nitride. Molecular beam epitaxy (MBE), metal-organic chemical vapor deposition (MOCVD), hydride vapor phase epitaxy (HVPE), pulsed laser deposition (PLD), and other non-sputtered epitaxial growth procedures may be used to realize the ferroelectric III-nitride alloys. Devices and structures including such materials are also described. For instance, various heterostructures and ferroelectronic devices with one or more ferroelectric scandium gallium nitride layers are described.

Examples of ferroelectric, single-phase wurtzite ScGaN grown on GaN by plasma-assisted molecular beam epitaxy are described herein. Distinct ferroelectric switching behavior was confirmed by detailed electrical characterization. Coercive fields in the range of 2.0-3.0 MV/cm, and large, retainable remnant polarization in the range of 60-120 $\mu C/cm^2$, are unambiguously demonstrated for ScGaN epilayers with Sc contents falling in a range from about 0.31 to about 0.41. Taking advantage of the widely tunable energy bandgap of III-nitride semiconductors, the demonstration of ferroelectricity in ScGaN, together with ferroelectric ScAlN, enable a broad range of emerging applications with combined functionality in ferroelectric, electronic, optoelectronic, photovoltaic, and/or photonic devices and systems.

Although described in connection with examples of epitaxially grown $Sc_xGa_{1-x}N$ layers, the disclosed methods and devices may be applied to a variety of gallium nitride alloys. The disclosed methods and devices may thus include or involve the incorporation of scandium into other gallium nitride wurtzite structures. For instance, the disclosed methods and devices may include or involve one or more epitaxially grown $Sc_xAl_yGa_{1-x-y}N$ layers or $Sc_xIn_yGa_{1-x-y}N$ layers. The configuration, construction, fabrication, and other characteristics of the heterostructures may also vary from the examples described. For instance, the heterostructures may include any number of epitaxially grown layers of ferroelectric and non-ferroelectric nature. The disclosed methods and devices are not limited to gallium nitride alloys including scandium. For instance, the III-nitride alloys may include additional or alternative group IIIB elements, such as yttrium (Y) and lanthanum (La).

The heterostructures of the disclosed devices may include any number of other alloys of III-nitride materials, including, for instance, $Sc_xAl_{1-x}N$ layers (e.g., single-crystalline $Sc_xAl_{1-x}N$). Such $Sc_xAl_{1-x}N$ layers may also be grown by plasma-assisted molecular beam epitaxy (MBE) and exhibit robust ferroelectric switching. Further details regarding such layers are set forth in U.S. Application Ser. No. 63/185,669, entitled "Epitaxial Nitride Ferroelectronics" and filed May 7, 2021, and P. Wang, et al., "Fully epitaxial ferroelectric ScAlN grown by molecular beam epitaxy," Applied Physics Letters 118, 223504 (2021), the entire disclosures of which are hereby incorporated by reference.

Given the widely tunable bandgap from about 3.4 eV for GaN to 6.1 eV for AlN, the realization of ferroelectricity in both $Sc_xGa_{1-x}N$ and $Sc_xAl_{1-x}N$ provides a unique material platform with widely tunable ferroelectricity, polarization, and bandgap and further enable alloy, strain, interface, and quantum engineering that was not possible previously. In addition, the bandgap of $Sc_xGa_{1-x}N$ is predicted to stay direct up to x=0.5, making $Sc_xGa_{1-x}N$ tantalizing for opto-electronic and photovoltaic applications.

Although described in connection with MBE growth procedures, additional or alternative non-sputtered epitaxial growth procedures may be used. For instance, metal-organic chemical vapor deposition (MOCVD) and hydride vapor phase epitaxy (HVPE) growth procedures may be used. Still other procedures may be used, including, for instance, pulsed laser deposition procedures.

Examples of unambiguous ferroelectric switching behavior in single-crystalline $Sc_xGa_{1-x}N$ films grown on GaN templates by MBE are described. X-ray diffraction (XRD) was used to confirm the wurtzite structure of the synthesized $Sc_xGa_{1-x}N$ films. The polarization switching process has been examined by multiple electrical characterization methods including P-E and J-E (polarization and current density over electric field, respectively) loops, positive-up-negative-down (PUND) measurements, and frequency-dependent measurements.

A wake-up or initiation process was observed during the first several measurement cycles. After sufficient poling, coercive fields in the range of 2.0-3.0 MV/cm, and large, retainable remnant polarization in the range of 60-160 $\mu C/cm^2$ were measured for $Sc_xGa_{1-x}N$ thin films with Sc contents of 0.31-0.41. The ferroelectric $Sc_xGa_{1-x}N$ examples described herein, together with ferroelectric $Sc_xAl_{1-x}N$, which may all be grown by MBE, enable a broad range of emerging heterostructures and applications with tunable and integrated functionality in ferroelectric, electronic, optoelectronic, photovoltaic, and photonic devices and systems.

Examples of $Sc_xGa_{1-x}N$ films were grown using a Veeco GENxplor MBE system equipped with a radio frequency (RF) plasma-assisted nitrogen source. Commercial GaN/sapphire templates (SinoVio Semiconductor Technol. (Dongguan) Co. Ltd.) with a dislocation density of about $5\times10^8$ $cm^{-2}$ were used as substrates and a 100-nm-thick Si-doped layer of GaN was first grown at about 700° C. as the bottom contact layer. $Sc_xGa_{1-x}N$ layers were then grown with a fixed Ga beam flux and the Sc content was controlled by tuning Sc/Ga beam equivalent pressure (BEP) ratio calibrated by energy dispersive x-ray spectroscopy (EDS). During ScGaN growth, all shutters were opened simultaneously without interruption. The doping concentration of the n-GaN layer was determined by secondary ion mass spectrometry (SIMS) as about $1\times10^{19}$ $cm^{-3}$ and the carrier concentration at room temperature was about $5\times10^{18}$ $cm^{-3}$ determined by Hall effect measurement. The substrate temperature was monitored by a thermocouple on the backside of the wafer calibrated by observing the reversible (7×7) to (1×1) reconstruction transition for Si(111) at 830° C. The III/V ratio for ScGaN growth was set to about 0.8 to about 0.85 to avoid Ga droplet formation. Pt/Al circular electrodes with a diameter of 20 $\mu m$ were lithographically patterned on top of the $Sc_xGa_{1-x}N$ films and indium solder was placed on the n-GaN as bottom electrode. All electrical characterizations, including polarization-electric (P-E) hysteresis loops and PUND measurements of the patterned $Sc_xGa_{1-x}N$ thin film capacitors were measured using a Radiant Precision Premier II ferroelectric tester driven from the bottom n-GaN contact layer. Triangular waveform sequences were used for measuring J-E and P-E loops and square pulses were adopted when doing PUND and retention tests. The setup and measurement method have been calibrated using standard commercial ferroelectric lead zirconium titanate (PZT) films to make sure they were able to extract the correct polarization. XRD 2theta-omega (2θ-ω) scans were performed using a Rigaku SmartLab diffractometer with a Cu $K_{\alpha1}$ radiation x-ray source (1.5406 Å).

$Sc_xGa_{1-x}N$ films with different Sc contents (0.31-0.41) were grown to explore the ferroelectric property of the material. The film thicknesses measured by cross-sectional scanning electron microscopy (SEM) were 100, 120, and 150 nm for $Sc_{0.31}Ga_{0.69}N$, $Sc_{0.36}Ga_{0.64}N$, and $Sc_{0.41}Ga_{0.59}N$, respectively. Part a of FIG. 1 depicts the typical atomic force microscope (AFM) image of a $Sc_xGa_{1-x}N$ example with x=0.31. A granular surface can be clearly observed, similar to those grown under N-rich conditions. A root-mean-square (RMS) roughness of 1.95 nm was measured for a scanned area of 10×10 $\mu m^2$. Other grown examples showed similar smooth surface morphology. Part b of FIG. 1 shows the (002) plane XRD 2θ-ω scan results for the $Sc_xGa_{1-x}N$ examples with x=0.31, 0.36 and 0.41. It is seen that the $Sc_xGa_{1-x}N$ (002) diffraction peaks gradually shift to a higher angle with increasing x, indicating a reduced out-of-plane lattice parameter c, which is consistent with the trend reported in previous studies. The peak around 35.5° is from a sputter-deposited AlN buffer in the commercial GaN/sapphire template. Well-defined $Sc_xGa_{1-x}N$ (002) peaks can be found for Sc contents of 0.31 and 0.36, whereas a broad peak is observed for $Sc_xGa_{1-x}N$ with a Sc content of 0.41, indicating a degraded material quality with increasing Sc incorporation. No peaks from other phases were observed in a longer scan range (2θ=30–100°). Those characteristic peaks thus confirmed the wurtzite structure of the $Sc_xGa_{1-x}N$ films. The (002) plane XRD rocking curve full-width-half-maximum (FWHM) of the $Sc_{0.31}Ga_{0.69}N$ film was about 1.3 degrees. The growth conditions may be varied in other examples, and may improve the material quality of the resulting ScGaN films. For instance, the growth temperature and nitrogen-to-metal flux ratio may be varied. In some cases, the growth temperature is in a lower temperature range, such as at or below about 600 degrees Celsius. In other cases, a nitrogen-to-metal flux ratio higher than 1 may be used.

Owing to the difficulties in determining Sc content from XRD 2θ-ω scans, EDS equipped in a SEM was used to calibrate the Sc content using $Sc_xGa_{1-x}N$ films grown on AlN templates under the same growth conditions. The accelerating voltage and emission current used for EDS measurements were 10 kV and 10 µA, respectively, with an error bar of ±2%. The Sc contents acquired from EDS were in good agreement with the values derived from BEP ratios.

Figure 2:
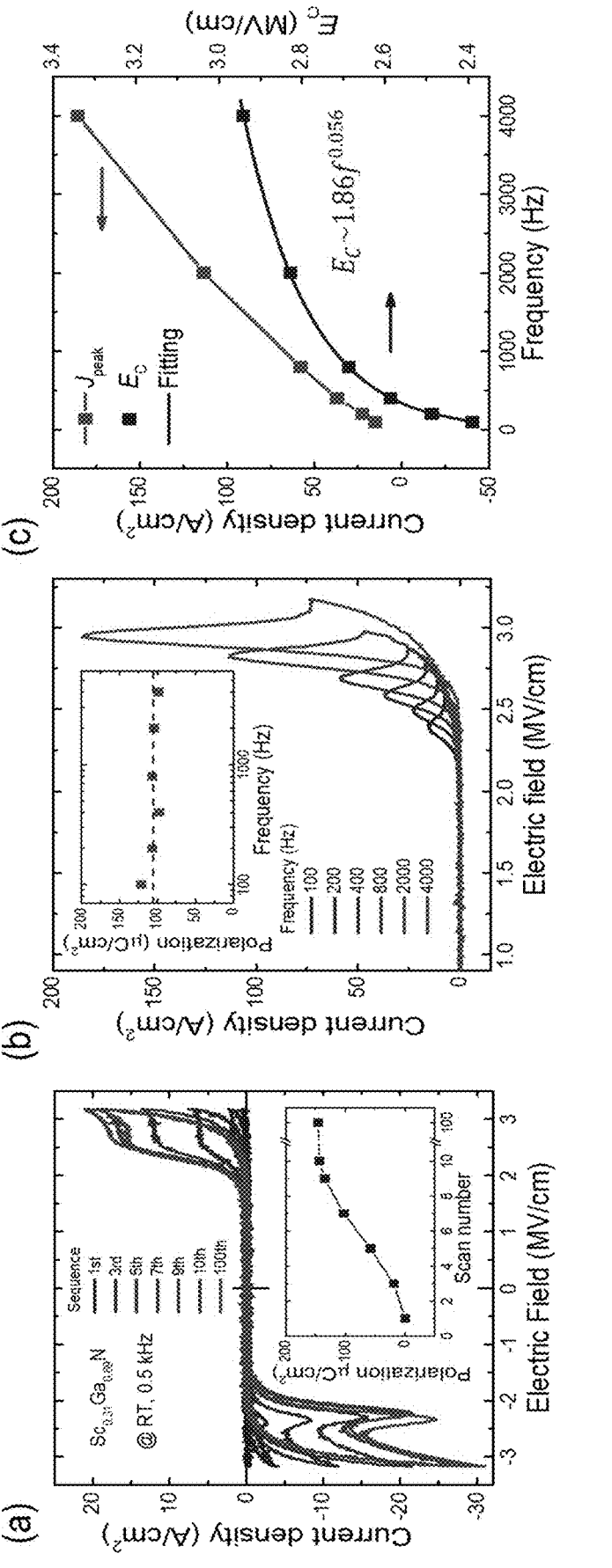
FIG. 2 depicts graphical plots of current density as a function of electric field over a range of scan cycles and measurement frequencies for an epitaxially grown $Sc_xGa_{1-x}$ N layer in accordance with one example, along with a graphical plot of peak current densities and coercive field for the epitaxially grown $Sc_xGa_{1-x}N$ layer over the range of measurement frequencies.

To investigate and characterize the polarization switching behavior in the examples, a bipolar triangular AC voltage waveform was applied to the bottom electrode and the displacement current was sensed by the top electrode. Part a of FIG. 2 shows the first several J-E loops of a $Sc_{0.31}Ga_{0.69}N$ example. Interestingly, the $Sc_xGa_{1-x}N$ measured shows a unique wake-up behavior during which the polarization gradually stabilizes after about 10 scans. Therefore, to precisely quantify the remnant polarization, all examples were pre-stressed by 100 cycles of triangular AC inputs with $E_{max}/E_C=1.1$ to exclude the effect of wake up, where $E_{max}$ is the maximum applied electric field during stressing and $E_C$ is the coercive field. Part b of FIG. 2 shows the frequency dependent negative branches of the J-E curves for a $Sc_{0.31}Ga_{0.69}N$ example. For a ferroelectric capacitor, the remnant polarization may be constant. In other words, the switching current increases with measurement frequency considering $\Delta P \propto \int J(t)dt$, which agrees well with the trend shown in Part b of FIG. 2. Additionally, the average polarization, i.e., half of the switching polarization associated with the J-E curves, has been extracted and shown in the inset. The nearly static polarization over frequency indicates that the current peaks in Parts a and b of FIG. 2 are from ferroelectric polarization switching. Part c of FIG. 2 summarizes the peak current densities as well as the coercive field (defined as the electric field where the current peaks) over measurement frequency. The peak current density is nearly proportional to the measurement frequency, while the frequency-dependence of the coercive field follows the generic power law for conventional ferroelectric materials as $E_C$ of about 1.86 $f^{0.056}$ MV/cm in the measured frequency range (100-4000 Hz). While at higher frequencies the fitted parameters may change, the exponent value here is similar to those reported on PZT films at lower frequencies, further confirming the ferroelectric origin of the observed J-E behavior.

Figure 3:
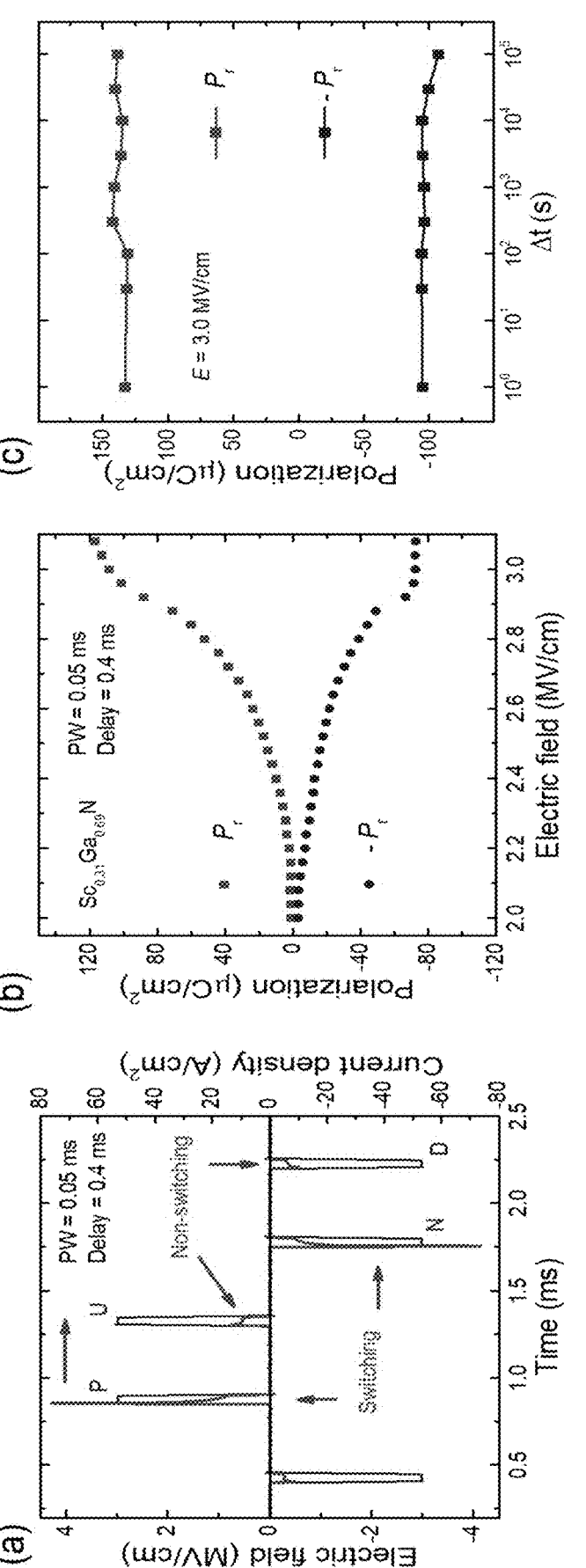
FIG. 3 depicts a graphical plot of a transient positive-up-negative-down (PUND) profile for the example of FIG. 2, along with graphical plots of PUND test results and retention testing for the example with a driving electric field slightly larger than the coercive field.

Part a of FIG. 3 shows PUND transients with a driving electric field of 3.0 MV/cm. Narrower pulses lead to a high switching voltage and thus enhanced leaky conduction, and possible incomplete switching. Some devices cannot reach saturation before breakdown when the pulse width is too small. On the other hand, due to the leaky feature of current devices, the pulse width should not be too wide to avoid Joule heating. Therefore, a pulse width (PW) of 0.05 ms was chosen to properly present the results. Current peaks due to polarization switching can be clearly observed in the "P" and "N" sequences. The "U" and "D" sequences show the non-switching current, the non-zero value of which shows the presence of leakage current. The magnitude of the switching current is about 7 times that of the non-switching current. Electric field dependent PUND measurement results are displayed in Part b of FIG. 3. A well placed saturation region can be found between 2.9-3.1 MV/cm for $Sc_{0.31}Ga_{0.69}N$, resulting in an average remnant polarization of about 100 µC/cm². PUND measurements on different examples exhibited that further increases in the electric field lead to a continuously increasing polarization, which could be attributed to high electric field enhanced leakage from dislocations or traps, because the electric field is near the breakdown field of the film ($E_{BD}$ of about 3.5-4.0 MV/cm). It is suspected that for PUND measurements on materials highly influenced by trap charging/discharging, the "set" pulse may simultaneously charge (discharge) the traps while pre-setting the direction of the polarization. These charged (discharged) traps then cause an additional current transient to the switching current in the "read" pulse, which may lead to differing assessments of the measured polarization. To partly address this issue, a modified PUND waveform—in which a small voltage pulse was applied before each "read" pulse to compensate the trapped carriers generated during "set" pulse while keeping the polarization direction unchanged—was adopted to evaluate the contribution from trapping. The nearly constant polarization over compensation field before ferroelectric switching happens indicates that the polarization values in Part b of FIG. 3 are mainly from ferroelectric switching. Unipolar measurement sequences with consecutively PUUU and NDDD waveforms were also conducted to help determine if switching is happening. Part c of FIG. 3 shows retention test results measured using the same pulse sequences reported in the above-referenced publication. The remnant polarization in both directions ($P_r$ and $-P_r$) were found to stay almost unchanged over a retention time of $10^5$ seconds, indicating little polarization loss. Measurements on different devices revealed similar results.

Finally, the polarization switching behavior of $Sc_xGa_{1-x}N$ examples with varying Sc contents were explored.

Figure 4:
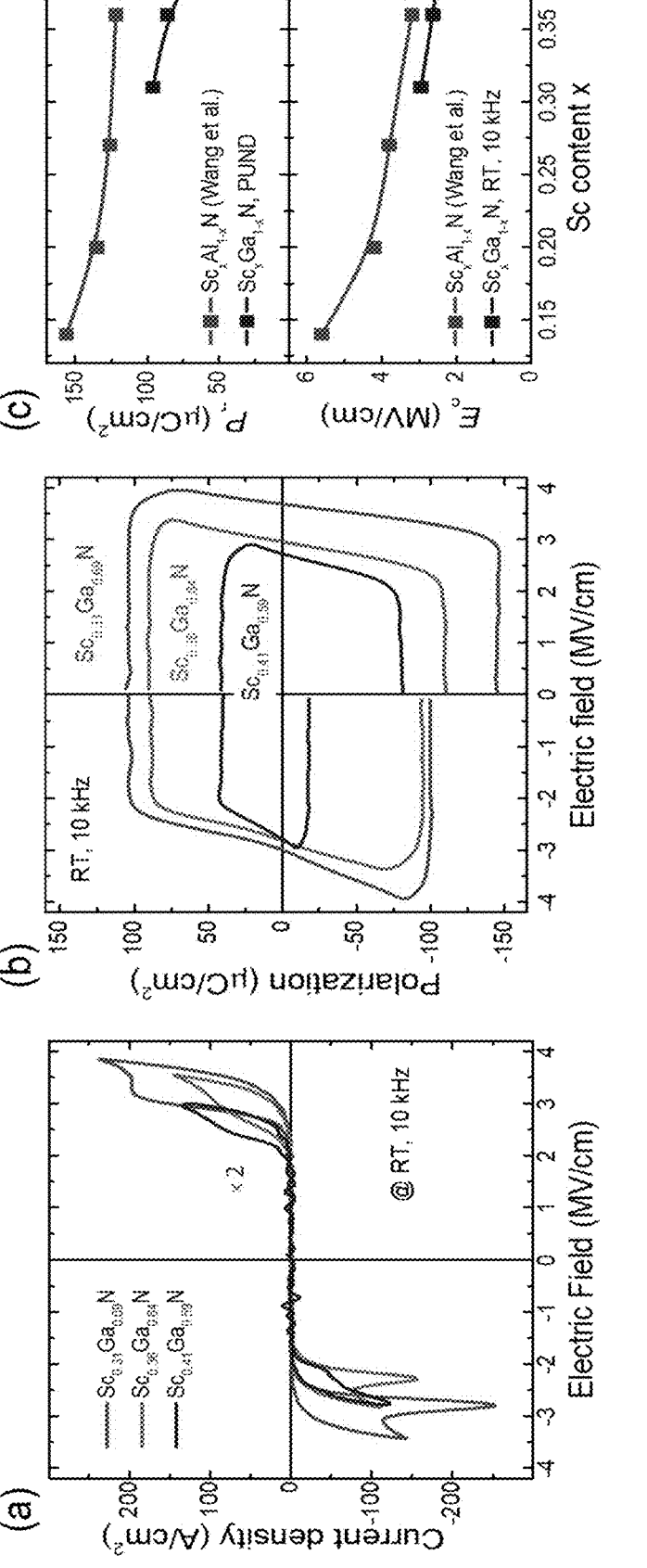
FIG. 4 depicts a graphical plot of current density as a function of electric field for a number of epitaxially grown $Sc_xGa_{1-x}N$ layers in accordance with several examples with varying levels of scandium content, along with graphical plots of polarization as a function of electric field, coercive field and remnant polarization.

Part a of FIG. 4 elucidates the J-E loops measured for the $Sc_xGa_{1-x}N$ examples using a triangular voltage input at a frequency of 10 kHz. Clear current peaks or bumps are observed for all three examples, despite the high leakage current. The asymmetric behavior of the J-E loops may be due to the difference in the top ($Sc_xGa_{1-x}N$ to metal) and bottom contacts ($Sc_xGa_{1-x}N$ to n-GaN/metal) and a polarization dependent leakage. A depletion region may exist when the polarity points to the top electrode, which may lead to a larger coercive field under positive bias compared with negative bias, as seen in Part a of FIG. 2 and Part a of FIG. 4. Because the coercive fields determined by the two branches (one with depletion region and the other without) are similar, the effect of a possible depletion layer in GaN is expected to be small. Therefore, the extracted coercive fields should be reasonably close to the actual values. By using triangular waveforms containing switching and non-switching parts, box-shape P-E loops were obtained and shown in Part b of FIG. 4. Similar to $Sc_xAl_{1-x}N$, a decrease in remnant polarization and coercive field with increasing Sc content can be observed, showing the enhanced softening of the wurtzite lattice with increasing Sc insertion. J-E sequences were used to extract the P-E data in Part b of FIG. 4.

Part c of FIG. 4 summarizes the remnant polarization and coercive field together with the results from MBE grown ferroelectric $Sc_xAl_{1-x}N$ films reported recently. Compared with $Sc_xAl_{1-x}N$, $Sc_xGa_{1-x}N$ exhibits a relatively lower coercive field, although a slight reduction in remnant polarization is noticed. The smaller remnant polarization in $Sc_xGa_{1-x}N$ compared with $Sc_xAl_{1-x}N$ is consistent with the theoretical predictions for AlN and GaN. Here, the Sc content window for ferroelectricity in $Sc_xGa_{1-x}N$ appears narrower than $Sc_xAl_{1-x}N$. $Sc_xGa_{1-x}N$ examples with x<0.3 were also prepared. However, the devices exhibited relatively small remnant polarization which became elusive during the retention test, and could not be easily claimed as ferroelectricity. Actually, with a lower Sc content, the coercive field is expected to increase. However, the band gap and associated breakdown field are expected to decrease with decreasing Sc content, making it difficult to realize ferroelectric switching in low-Sc-content ScGaN without breakdown. The Sc content may vary in other cases. For instance, improvement in material quality may further extend the Sc content window for ferroelectric $Sc_xGa_{1-x}N$ films.

Figure 5:
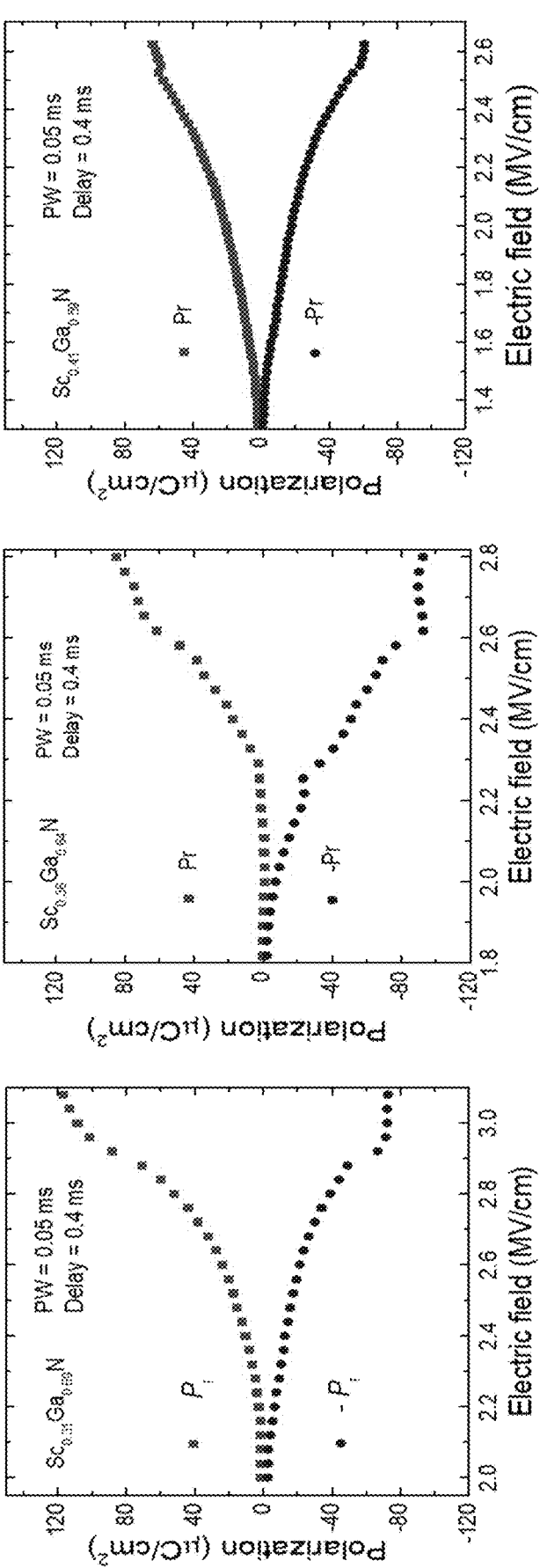
FIG. 5 depicts graphical plot of transient positive-up-negative-down (PUND) profiles for a number of epitaxially grown $Sc_xGa_{1-x}N$ layers with varying levels of scandium content in accordance with several examples.

FIG. 5 depicts PUND measurement results for three ScGaN examples with different Sc content using an example waveform. The PUND measurements were taken using square pulses with a pulse width of 0.05 ms and a delay time of 0.4 ms. Polarization saturation can be observed on all examples, and the remnant polarizations extracted show a decreasing trend with increasing Sc content, and are consistent with the values from P-E loops as shown in Part b of FIG. 4.

Described herein are examples of distinct ferroelectric functionality in single-crystalline wurtzite phase $Sc_xGa_{1-x}N$ films grown by MBE. Coercive fields in the range of 2.0-3.0 MV/cm, and large, retainable remnant polarization in the range of 60-120 $\mu C/cm^2$, were demonstrated for $Sc_xGa_{1-x}N$ thin films with Sc contents of 0.31-0.41. Given the widely tunable bandgap and lattice parameters between GaN and AlN, the fully epitaxial ferroelectric $Sc_xGa_{1-x}N$ together with $Sc_xAl_{1-x}N$ will be useful in a broad range of current and emerging applications, e.g., with tunable and integrated functionality, in ferroelectric, electronic, optoelectronic, photovoltaic, and photonic devices and systems.

Figure 6:
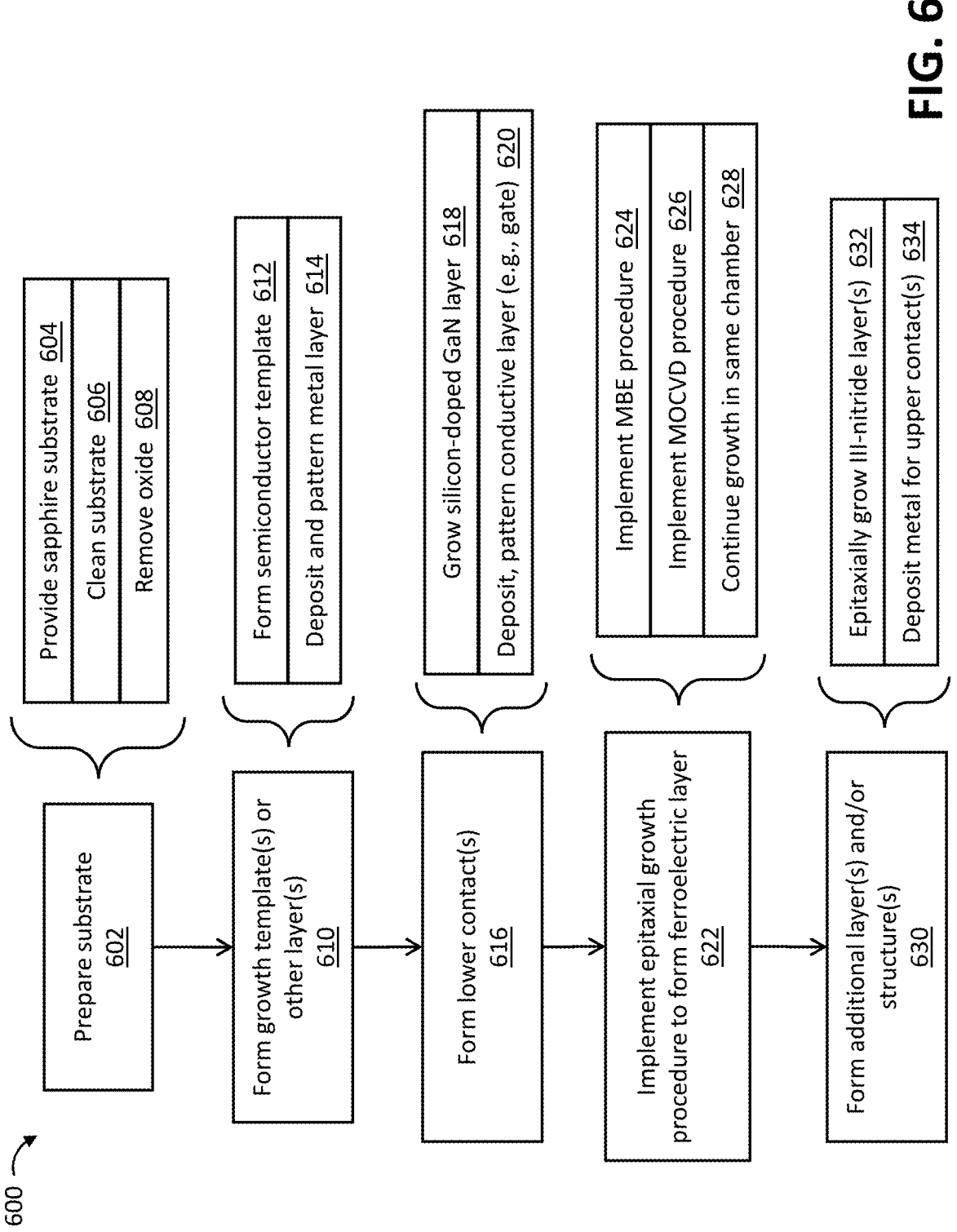
FIG. 6 is a flow diagram of a method of fabricating a heterostructure having an epitaxially grown ferroelectric wurtzite structure in accordance with one example.

FIG. 6 depicts a method 600 of fabricating a heterostructure having a wurtzite structure of an alloy of a III-nitride material with scandium incorporated therein in accordance with one example. As described herein, the method 600 is configured such that the wurtzite structure exhibits ferroelectric behavior. The heterostructure may form a device, or a part of a device, in which one or more layers or regions of the device exhibit the ferroelectric behavior. The method 600 may be used to fabricate the examples of $Sc_xGa_{1-x}N$ films and layers described herein.

The method 600 may begin with an act 602 in which a substrate is prepared and/or otherwise provided. In some cases, the act 602 includes providing a sapphire substrate in an act 604. Alternative or additional materials may be used, including, for instance, silicon, bulk GaN, bulk AlN, or other semiconductor material. Still other materials may be used, including, for instance, silicon carbide. The substrate may be cleaned in an act 606. In some cases, a native or other oxide layer may be removed from a substrate surface in an act 608. Additional or alternative processing may be implemented in other cases, including, for instance, doping or deposition procedures. The substrate thus may or may not have a uniform composition. The substrate may be a uniform or composite structure.

In an act 610, one or more growth templates or other layers are formed. The layer(s) are thus formed on, or otherwise supported by, the substrate. The layer(s) may or may not be in contact with the substrate. In some cases, the layer(s) are composed of, or otherwise include, a semiconductor material. For instance, the act 610 may include an act 612 in which a semiconductor layer is formed. For example, a III-nitride layer, such as a GaN layer, may be grown or otherwise formed on the substrate. Other compound or other semiconductor materials may be used, including, for instance, AlN or AlGaN. The act 612 may thus be implemented before (e.g., in preparation for) implementing an epitaxial growth procedure in which a wurtzite structure is formed. The wurtzite structure may thus be formed on the semiconductor layer. The semiconductor layer may be configured or used as a growth template for the wurtzite structure and/or other elements of the heterostructure. In some cases, the act 612 may include growing the semiconductor layer in an epitaxial growth chamber in which the epitaxial growth procedure for the wurtzite structure is implemented. As a result, the substrate may remain within, e.g., is not removed from, the epitaxial growth chamber between forming the semiconductor layer and implementing the epitaxial growth procedure for growing the wurtzite structure.

Alternatively or additionally, the act 610 includes an act 614 in which one or more metal or other conductive layers are deposited and patterned. For example, an aluminum layer may be deposited on a silicon substrate in preparation for the epitaxial growth of the wurtzite structure.

The method 600 may include an act 616 in which one or more contacts are formed. In the example of FIG. 6, the contact(s) are configured as a lower or bottom contact of the heterostructure. In some cases, the act 616 includes growing a silicon-doped GaN layer in an act 618. Additional or alternative conductive structures, such as a gate structure, may be deposited and/or patterned in an act 620.

In an act 622, a non-sputtered epitaxial growth procedure is implemented to form a wurtzite structure supported by the substrate. As described herein, the wurtzite structure is composed of, or otherwise includes, an alloy of gallium nitride. For instance, the alloy may be ScGaN. Additional or alternative III-nitride materials may be used, including, for instance, gallium nitride (ScInGaN) and other alloys of gallium nitride. As also described herein, the epitaxial growth procedure is configured to incorporate scandium and/or another group IIIB element into the alloy of the III-nitride material. The alloy may thus be $Sc_xGa_{1-x}N$, for example. In some cases, the act 622 includes an act 624 in which an MBE procedure is implemented. In other cases, an MOCVD or other non-sputtered epitaxial growth procedure is implemented in an act 626.

The act 622 may constitute a continuation, or part of a sequence, of growth procedures. The growth procedures may be implemented in a common, or same, growth chamber. The act 622 may thus include an act 628 in which epitaxial growth is continued in the same chamber. Sequential layers of the heterostructure may thus be grown without exposure to the ambient. The quality of the interface between the layers may accordingly be improved.

The growth temperature may be at a level such that the wurtzite structure exhibits a breakdown field strength greater than a ferroelectric coercive field strength of the wurtzite structure. Ferroelectric switching and other behavior may thus be achieved. Growth of a single crystal of the scandium-including alloy (e.g., a monocrystalline layer of the alloy) is also achieved. For example, in some cases, a $Sc_xGa_{1-x}N$ alloy may be epitaxially grown at a growth temperature of about 600 degrees Celsius or less. The $Sc_xGa_{1-x}N$ layer may be grown at other growth temperatures, e.g., as described herein. In some cases, a nitrogen-to-metal flux ratio higher than 1 may be used.

The growth temperature may correspond with the temperature measured at a thermocouple in the growth chamber. The growth temperature at the epitaxial surface may be slightly different. The growth temperature is accordingly approximated via the temperature measurement at the thermocouple.

At each level within the range of suitable growth temperatures, the resulting wurtzite structure is monocrystalline. The resulting wurtzite structure is monocrystalline to a degree not realizable via, for instance, sputtering-based procedures for forming $Sc_xGa_{1-x}N$ layers. Such procedures are only capable of producing structures with x-ray diffraction rocking curve line widths on the order of a few degrees at best. In contrast, the structures grown by the disclosed methods exhibit x-ray diffraction rocking curve line widths on the order of a few hundred arc-seconds or less, well over an order of magnitude less. In this manner, leakage current paths are minimized or otherwise sufficiently reduced so that the resulting wurtzite structure has a suitably high breakdown field strength level, e.g., sufficiently greater than the ferroelectric coercive field strength.

The above-noted differences in crystal quality evidenced via x-ray diffraction rocking curve line widths may also be used to distinguish between monocrystalline and polycrystalline structures. As used herein, the term "polycrystalline" refers to structures having x-ray diffraction rocking curve line widths on the order of a few degrees or higher. As used herein, the term "monocrystalline" refers to structures having x-ray diffraction rocking curve line widths at least one order of magnitude lower than the order of a few degrees.

Comparing the wurtzite structures of the layers grown by MBE or other non-sputtered techniques (e.g., MOCVD or HVPE) with sputtering deposition techniques, the microstructure of the former techniques is more uniform with highly ordered stacking sequence of atoms. In sputter deposited layers, domains with cubic phase or domains with in-plane mis-orientation are readily observed. The existence of these mis-aligned domains suppresses the complete switching of polarization, and further results in the fast loss of polarization during fatigue testing. Regarding phase purity, the highly crystallographic orientation of layers grown by MBE or other non-sputtered techniques exhibits more repeatable ferroelectric switching, which is useful in a number of device applications.

The method 600 may include an act 630 in which one or more layers (e.g., semiconductor layers) are formed after growth of the wurtzite structure. As a result, the layer(s) may be in contact with the wurtzite structure. For instance, one or more III-nitride (e.g., GaN or AlGaN) or other semiconductor layers may be epitaxially grown in an act 632. The act 632 may be implemented in the same epitaxial growth chamber used to grow the wurtzite structure. As a result, the substrate (and heterostructure) is not removed from the epitaxial growth chamber between implementing the acts 622 and 630.

Alternatively or additionally, the act 630 includes an act 634 in which one or more metal or other conductive layers or structures are formed. The layers or structures may be deposited or otherwise formed. In some cases, the conductive structure is configured as an upper or top contact. For instance, the conductive structure may be a gate.

The method 600 may include one or more additional acts. For example, one or more acts may be directed to forming other structures or regions of the device that includes the heterostructure. In a transistor device example, the regions may correspond with source and drain regions. The nature of the regions or structures may vary in accordance with the nature of the device.

The order of the acts of the method 600 may differ from the example shown in FIG. 6. For example, the acts 616, 618, 620 in which contacts and/or other conductive structures formed may be implemented after the growth of the ferroelectric layer.

A number of different types of devices may be fabricated by the method 600 of FIG. 6, and/or another method of fabricating a heterostructure having a wurtzite structure of an alloy of a III-nitride material with scandium incorporated therein. For example, the ferroelectric $Sc_xGa_{1-x}N$ or other alloy of a III-nitride material may be useful in various types of nonvolatile memory devices (e.g., FeRAM, FeFET, FTJ, and FeSFET devices), various types of reconfigurable electronic and other devices (e.g., Fe-HEMT, Fe-capacitor, and SAW devices), various types of photodetection, photovoltaic and optoelectronic devices (e.g., self-driven photodetector and solar cell devices), and various homojunction devices (e.g., devices that use a laterally distributed charge plate to tune the Fermi level in adjacent layers). Still other types of devices may be fabricated, including, for instance, FE-based thin-film bulk acoustic wave resonators (FBAR) devices.

A number of example devices are now described. In each example, the device includes a substrate and a heterostructure supported by the substrate. The heterostructure includes a monocrystalline layer of an alloy of a III-nitride material. As described herein, the alloy includes scandium. As also described herein, the monocrystalline layer exhibits a breakdown field strength greater than a ferroelectric coercive field strength of the monocrystalline layer. In some cases, the III-nitride material is aluminum nitride (GaN), but other III-nitrides may be used.

In some of the devices described below, the heterostructure (or, more generally, the device) also includes a semiconductor layer disposed between the substrate and the monocrystalline layer (or, more generally, the heterostructure). The semiconductor layer may include a further III-nitride material, such as GaN. In some cases, the semiconductor layer is in contact with the heterostructure. The epitaxial growth of the layers may result in a high quality interface between the layers. Alternatively or additionally, the device also includes a metal or other conductive layer disposed between the substrate and the heterostructure. The metal layer may be in contact with the heterostructure, examples of which are described below.

Figure 7B:
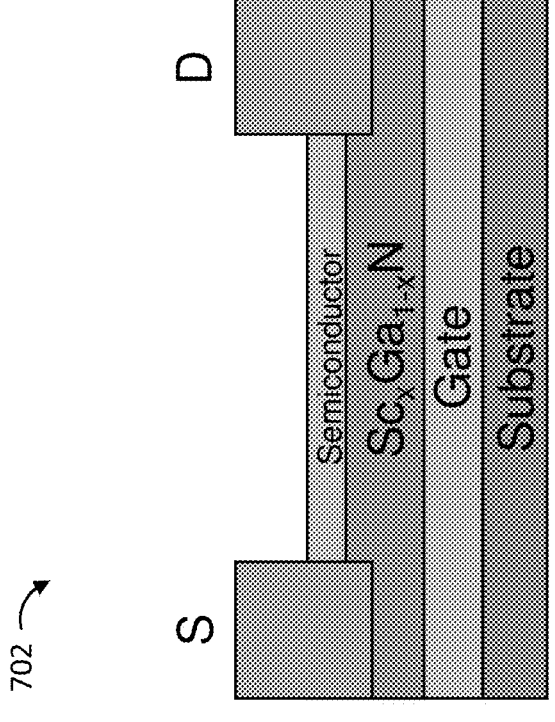
FIGS. 7A and 7B depict cross-sectional, schematic views of ferroelectric field effect transistor (FeFET) memory cells with a single-crystal, or monocrystalline, layer of an alloy of gallium nitride (e.g., $Sc_xGa_{1-x}N$) between a gate electrode and a source-drain conduction region to provide a reversible electrical state in accordance with two examples.
Figure 7A:
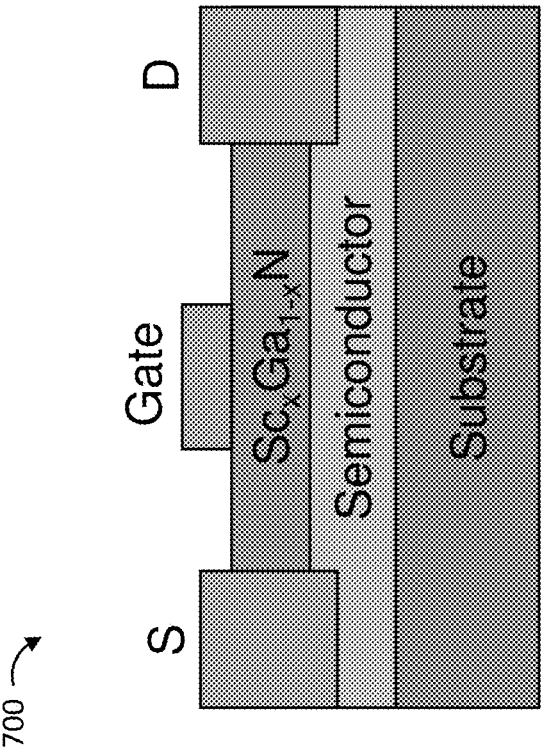

FIGS. 7A and 7B depict examples of FeFET memory devices 700, 702. In each example, a ferroelectric $Sc_xGa_{1-x}N$ layer is disposed between a gate electrode and a source-drain conduction region. The ferroelectric layer provides a reversible electrical state for a transistor of the device 700, 702. The large remnant electrical field polarization in the ferroelectric $Sc_xGa_{1-x}N$ layer retains the state of the transistor (e.g., on or off) in the absence of any electrical bias to form a single transistor nonvolatile memory. In some cases, bulk and/or other semiconductor channel layers are composed of, or otherwise include, GaN or silicon, or two-dimensional materials like $MoS_2$ or graphene. In each device 700, 702, the FeFET memory device 700, 702 may include a heterostructure including, for instance, the ferroelectric $Sc_xGa_{1-x}N$ or other alloy of a III-nitride material, along with one or more layers of a III-nitride semiconductor, such as GaN, as the gate dielectric and barrier. The substrate supporting these layers and structures of the devices may be composed of, or otherwise include, GaN or silicon, but additional or alternative materials may be used in other cases. The control terminal or gate may be disposed above or below the heterostructure as shown.

Other types of memory devices include one transistor, one capacitor (1T-1C) FeRAM devices. For example, a FeRAM device may include a MIM ferroelectric capacitor composed of, or otherwise including, Al, $Sc_xGa_{1-x}N$, and Al supported by a pre-processed silicon or GaN substrate.

Figure 8:
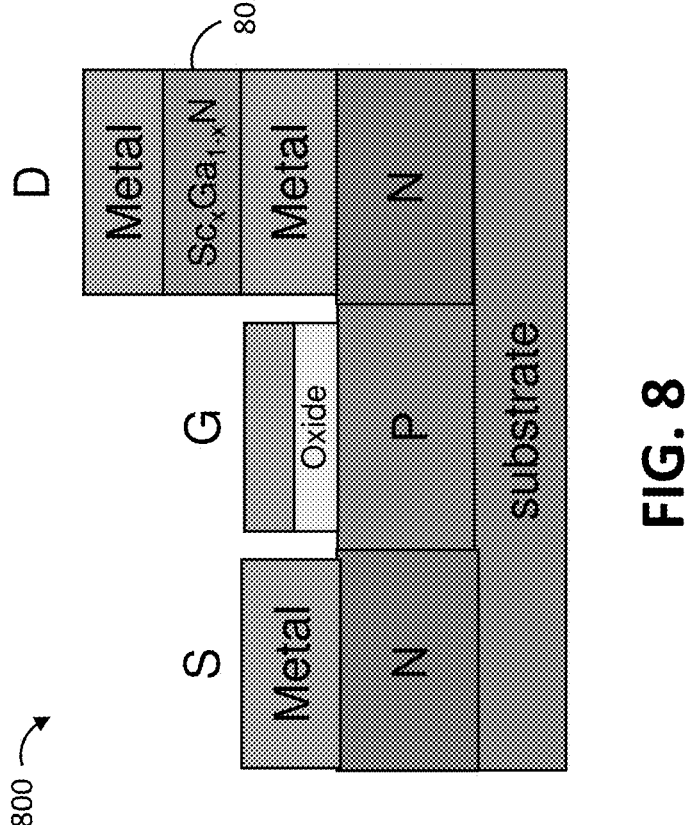
FIG. 8 depicts a cross-sectional, schematic view of a ferroelectric-transistor random-access memory cell with a metal-$Sc_xGa_{1-x}N$-metal capacitor and a silicon or GaN based write-read transistor in accordance with one example.

FIG. 8 depicts a device 800 in which a coupled FET structure is configured as a memory cell. During the switching of the remnant polarization state in a $Sc_xGa_{1-x}N$ layer 802, a current pulse is generated to indicate the stored binary information in the cell.

Figure 9B:
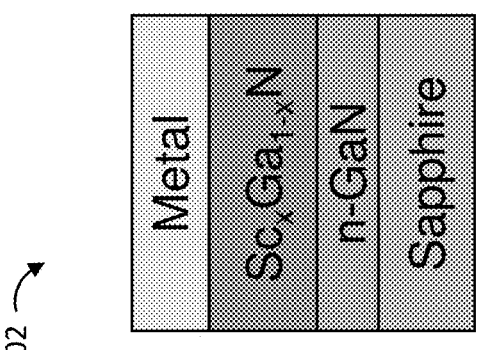
FIGS. 9A and 9B depict cross-sectional, schematic views of ferroelectric tunnel junction (FTJ) memory devices with a monocrystalline layer of an alloy of gallium nitride (e.g., $Sc_xGa_{1-x}N$) in accordance with two examples.
Figure 9A:
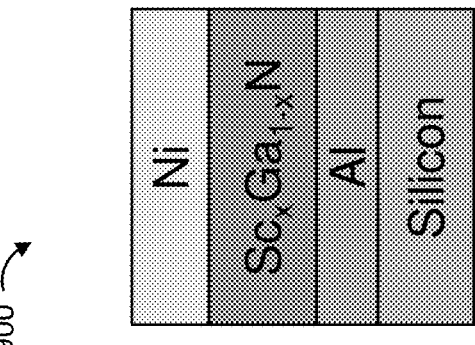

FIGS. 9A and 9B depict examples of FTJ memory devices 900, 902. In the device 900, an epitaxially grown ferroelectric layer is disposed between metal layers (e.g., nickel and aluminum layers). In the other device 902, a ferroelectric layer is disposed between a III-nitride semiconductor layer (e.g., n-type doped GaN) and a metal layer. Other metal-Fe (insulator)-metal and metal-(insulator)-Fe-(insulator)-semiconductor configurations may be used. In these example devices, the $Sc_xGa_{1-x}N$ or other alloy provides the ferroelectricity and tunes the ON/OFF current/resistance ratio as a memorizer readout.

Figures 10A, 10B:
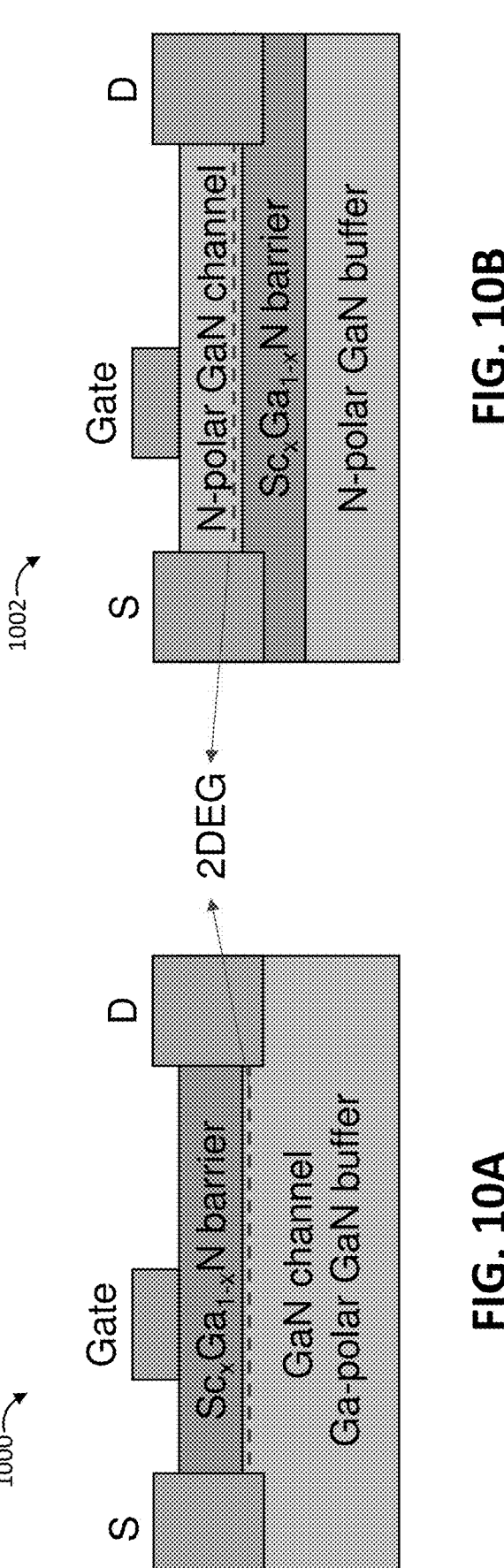
FIGS. 10A and 10B depict cross-sectional, schematic views of metal-polar and N-polar ferroelectric high electron mobility transistor (Fe-HEMT) devices, respectively, each having a monocrystalline layer of an alloy of gallium nitride (e.g., $Sc_xGa_{1-x}N$) in accordance with two examples.

FIGS. 10A and 10B depict examples of metal-polar and N-polar Fe-HEMT devices 1000, 1002, respectively. In these two examples, the devices 1000, 1002 include a heterostructure composed of, or otherwise including, a stack of ferroelectric $Sc_xGa_{1-x}N$ and channel layers. The heterostructure may be grown on a bulk or other region composed of, or otherwise including, a III-nitride semiconductor material, such as GaN. A switchable two-dimensional electron gas (2DEG) heterojunction may thus be formed due to the strong spontaneous polarization in the $Sc_xGa_{1-x}N$ layer during operation as shown. A thin AlN layer may be inserted between the $Sc_xGa_{1-x}N$ and channel layers to enhance carrier mobility.

Still other types of transistor devices may utilize the epitaxially grown ferroelectric layers described herein, including, for instance, N-polar bottom-gated and gate-recessed transistor devices, both with and without a gate oxide layer.

Figures 11A, 11B:
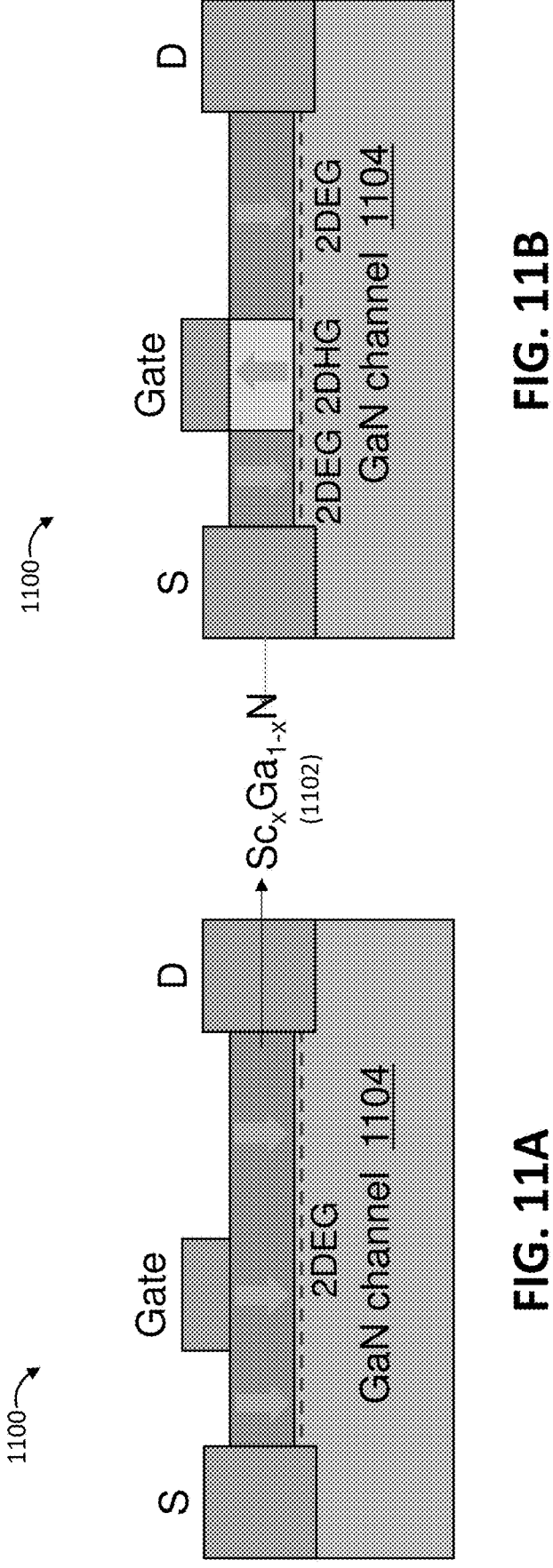
FIGS. 11A and 11B depict cross-sectional, schematic views of a reconfigurable Fe-HEMT device having a monocrystalline layer of an alloy of gallium nitride (e.g., $Sc_xGa_{1-x}$ N) in accordance with one example, in which the polarization direction, indicated by green arrows, of a ferroelectric layer under a gate can be reconfigured by applying an electric field beyond the coercive field.

FIGS. 11A and 11B depict two operational states of an example of a reconfigurable Fe-HEMT device 1100. In this example, the device 1100 includes a heterostructure composed of, or otherwise including, a stack of a ferroelectric $Sc_xGa_{1-x}N$ layer 1102 and a channel layer 1104. During operation, the polarization of the ferroelectric $Sc_xGa_{1-x}N$ layer 1102 can be switched, resulting in the formation a 2DHG or depletion region underlying the polarization switched region, as shown in FIG. 11B. Such switching may be implemented in other types of reconfigurable Fe-HEMT devices, including, for instance, the N-polar structure depicted in FIG. 10B.

Figure 12:
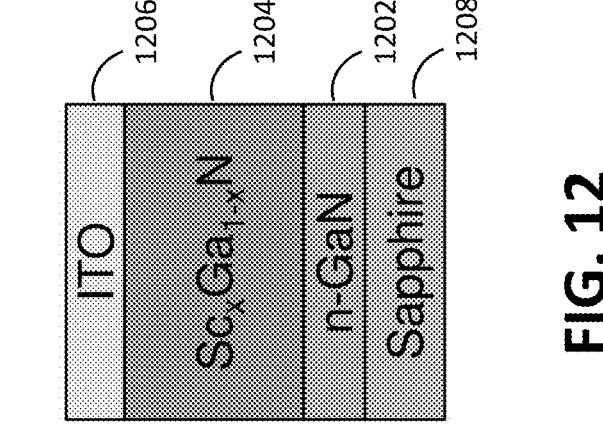
FIG. 12 depicts a cross-sectional, schematic view of a ferroelectric photovoltaic device with a monocrystalline layer of an alloy of gallium nitride (e.g., $Sc_xGa_{1-x}N$) as a photon absorption layer in accordance with one example.

FIG. 12 depicts an example of a photovoltaic device 1200 in which a ferroelectric layer is integrated into a heterostructure having one or more III-nitride layers between electrodes of the device 1200. In the example shown, the heterostructure includes an n-type GaN layer 1202 adjacent to, and in contact with a ferroelectric $Sc_xGa_{1-x}N$ layer 1204. A transparent conductive layer 1206 establishes one of the electrodes (e.g., a transparent cathode or anode) of the device 1200. Photon-generated carriers in the $Sc_xGa_{1-x}N$ layer 1204 are separated and collected by the polarization-induced electric field. The heterostructure may be supported by a sapphire or other substrate 1208.

Figures 13A, 13B:
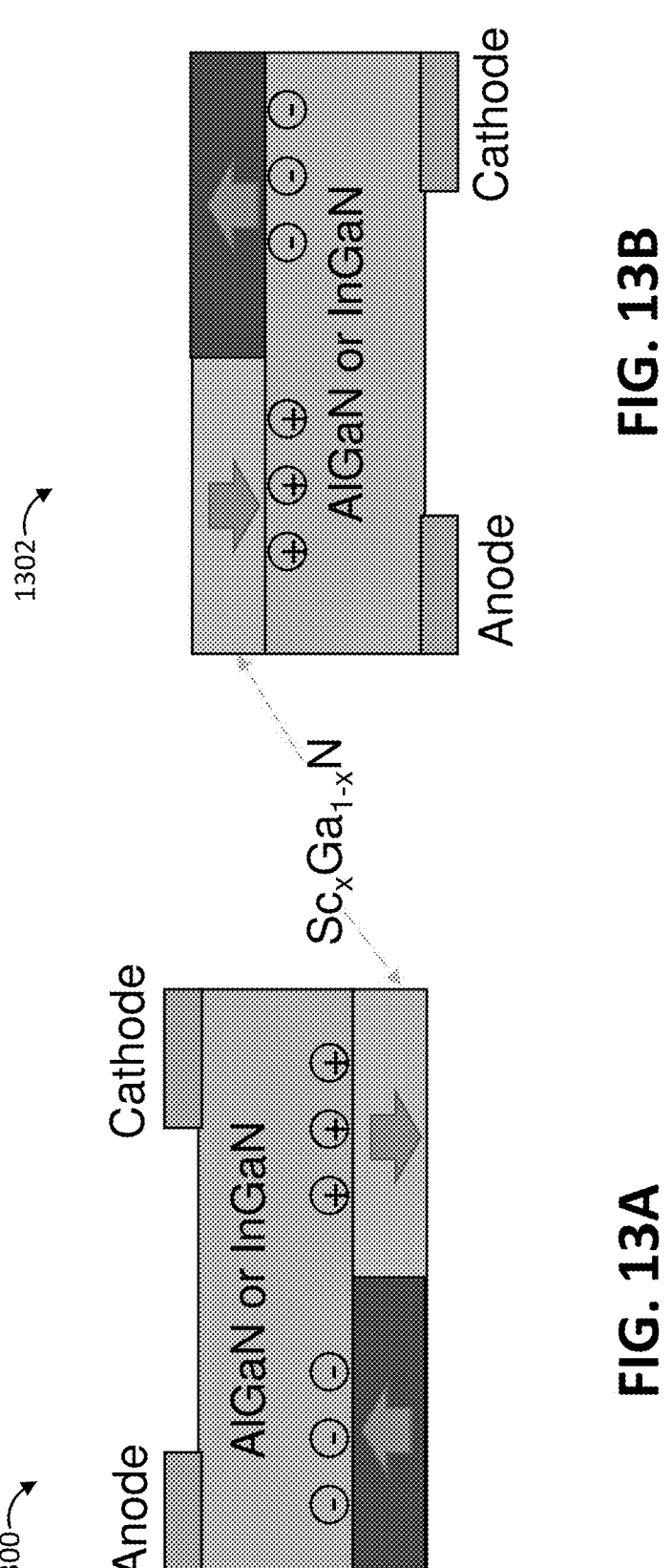
FIGS. 13A and 13B depict cross-sectional, schematic views of ferroelectric photovoltaic devices, each having a monocrystalline layer of an alloy of gallium nitride (e.g., $Sc_xGa_{1-x}N$) to provide one or more ferroelectric regions, and further having a monocrystalline layer of a III-nitride material as a photon absorption layer in accordance with two examples.

FIGS. 13A and 13B depict further examples of photovoltaic devices 1300, 1302. In each example, the polarization in a ferroelectric layer attracts electron/hole charges to different regions, thereby creating a built-in electric field in a light-absorption layer and helping to separate and collect the photon-generated carriers.

Figure 14:
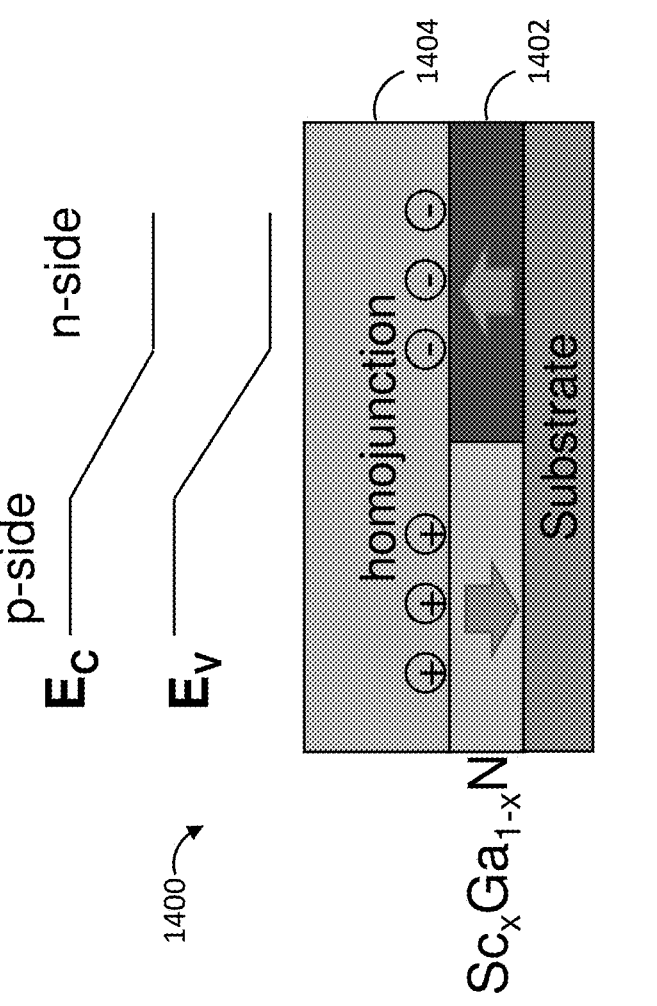
FIG. 14 depicts a cross-sectional, schematic view of a lateral homojunction device with a monocrystalline layer of an alloy of gallium nitride (e.g., $Sc_xGa_{1-x}N$) to provide one or more ferroelectric regions in accordance with one example.

FIG. 14 depicts an example of a homojunction device 1400 having a ferroelectric layer 1402 adjacent a channel layer or region 1404. The modulated polarization in the ferroelectric layer 1402 attracts electrons and holes in opposite directions, thereby forming a lateral homo p-n junction inside the channel region 1404. The homojunction may be formed in semiconductors such as GaN, Si and two-dimensional materials.

Figure 15:
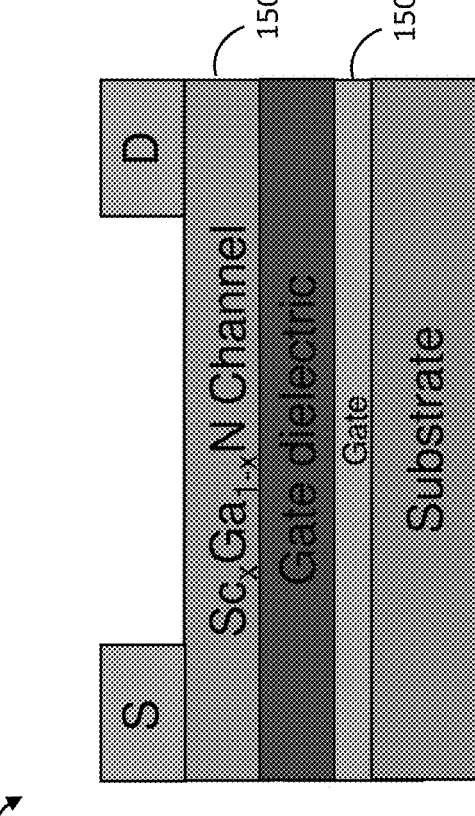
FIG. 15 depicts a field effect transistor device having a ferroelectric semiconductor channel layer in accordance with one example.

FIG. 15 depicts an example of a field effect transistor device 1500 having a ferroelectric semiconductor channel layer 1502. The modulated polarization in the ferroelectric layer 1502 attracts or repulses electrons in the channel 1502, thereby forming a conductive/insulating channel state with current/resistance ON/OFF ratio as a memorizer readout. The state of the channel 1502 may be controlled by a gate electrode layer 1504, which may be composed of, or otherwise include, silicon-doped GaN.

The term "about" is used herein in a manner to include deviations from a specified value that would be understood by one of ordinary skill in the art to effectively be the same as the specified value due to, for instance, the absence of appreciable, detectable, or otherwise effective difference in operation, outcome, characteristic, or other aspect of the disclosed methods and devices.

The present disclosure has been described with reference to specific examples that are intended to be illustrative only and not to be limiting of the disclosure. Changes, additions and/or deletions may be made to the examples without departing from the spirit and scope of the disclosure.

The foregoing description is given for clearness of understanding only, and no unnecessary limitations should be understood therefrom.

What is claimed is:

1. A method of fabricating a heterostructure, the method comprising:

providing a substrate; and implementing a non-sputtered, epitaxial growth procedure at a growth temperature to form a wurtzite structure supported by the substrate, the wurtzite structure comprising an alloy of gallium nitride, the non-sputtered, epitaxial growth procedure being configured to incorporate a group IIIB element into the alloy;

wherein the growth temperature is set at a level such that the wurtzite structure is monocrystalline to an extent that the wurtzite structure exhibits a breakdown field strength greater than a ferroelectric coercive field strength of the wurtzite structure.

2. The method of claim 1, further comprising forming a semiconductor layer supported by the substrate before implementing the non-sputtered, epitaxial growth procedure such that the wurtzite structure is formed on the semiconductor layer.

3. The method of claim 2, wherein forming the semiconductor layer comprises forming a gallium nitride layer on the substrate.

4. The method of claim 2, wherein forming the semiconductor layer comprises growing the semiconductor layer in an epitaxial growth chamber in which the non-sputtered, epitaxial growth procedure for the wurtzite structure is implemented such that the substrate is not removed from the epitaxial growth chamber between forming the semiconductor layer and implementing the non-sputtered, epitaxial growth procedure.

5. The method of claim 1, further comprising forming a semiconductor layer after implementing the non-sputtered, epitaxial growth procedure such that the semiconductor layer is in contact with the wurtzite structure.

6. The method of claim 5, wherein forming the semiconductor layer comprises growing the semiconductor layer in an epitaxial growth chamber in which the non-sputtered, epitaxial growth procedure for the wurtzite structure is implemented such that the substrate is not removed from the epitaxial growth chamber between implementing the non-sputtered, epitaxial growth procedure and forming the semiconductor layer.

7. The method of claim 1, wherein the group IIIB element is scandium.

8. The method of claim 7, wherein the scandium has a content falling in a range from about 0.31 to about 0.41.

9. The method of claim 1, wherein the substrate comprises sapphire.

10. The method of claim 1, wherein the growth temperature is about 600 degrees Celsius or lower.

11. The method of claim 1, wherein the non-sputtered, epitaxial growth procedure has a nitrogen-to-metal flux ratio greater than 1.

12. The method of claim 1, wherein a III/V ratio of the non-sputtered, epitaxial growth procedure is set to avoid Ga droplet formation.

13. The method of claim 12, wherein the III/V ratio falls in a range from about 0.8 to about 0.85.

14. The method of claim 1, wherein a Ga beam flux of the non-sputtered, epitaxial growth procedure is fixed during implementation of the non-sputtered, epitaxial growth procedure.

15. A method of fabricating a heterostructure, the method comprising:

providing a substrate; and implementing a non-sputtered, epitaxial growth procedure to form a wurtzite structure supported by the substrate, the wurtzite structure comprising an alloy of gallium nitride, the non-sputtered, epitaxial growth procedure being configured to incorporate a group IIIB element into the alloy;

wherein a growth temperature of the non-sputtered, epitaxial growth procedure is set to a level such that leakage paths in the wurtzite structure are reduced to an extent that the wurtzite structure exhibits a breakdown field strength greater than a ferroelectric coercive field strength of the wurtzite structure.

16. The method of claim 15, wherein the non-sputtered, epitaxial growth procedure is configured such that the wurtzite structure is monocrystalline.

17. The method of claim 15, wherein:

the growth temperature is about 600 degrees Celsius or lower; and the non-sputtered, epitaxial growth procedure has a nitrogen-to-metal flux ratio greater than 1.

18. The method of claim 15, wherein a III/V ratio of the non-sputtered, epitaxial growth procedure is set to avoid Ga droplet formation.

19. A method of fabricating a heterostructure, the method comprising:

providing a substrate; and implementing a non-sputtered, epitaxial growth procedure to form a wurtzite structure supported by the substrate, the wurtzite structure comprising an alloy of gallium nitride, the non-sputtered, epitaxial growth procedure being configured to incorporate a group IIIB element into the alloy;

wherein a growth temperature and a III/V ratio of the non-sputtered, epitaxial growth procedure are set such that the wurtzite structure exhibits a breakdown field strength greater than a ferroelectric coercive field strength of the wurtzite structure.

20. The method of claim 19, wherein:

the non-sputtered, epitaxial growth procedure is configured such that the wurtzite structure is monocrystalline;

the growth temperature is about 600 degrees Celsius or lower; and the III/V ratio falls in a range from about 0.8 to about 0.85.

* * * * *